US006928926B2

(12) United States Patent
Koifman et al.

(10) Patent No.: US 6,928,926 B2
(45) Date of Patent: Aug. 16, 2005

(54) PROCESS AND MATERIAL FOR PRODUCING IR IMAGED GRAVURE CYLINDERS

(75) Inventors: Igal Koifman, Hadera (IL); Murray Figov, Raanana (IL); Elena Eisurovich, Hadera (IL)

(73) Assignee: Creo IL Ltd., Herzlia Pituach (IL)

( * ) Notice: Subject to any disclaimer, the term of this patent is extended or adjusted under 35 U.S.C. 154(b) by 23 days.

(21) Appl. No.: 10/469,598

(22) PCT Filed: Jan. 14, 2002

(86) PCT No.: PCT/IL02/00029

§ 371 (c)(1),
(2), (4) Date: Sep. 2, 2003

(87) PCT Pub. No.: WO02/070257

PCT Pub. Date: Sep. 12, 2002

(65) Prior Publication Data

US 2004/0216627 A1 Nov. 4, 2004

Related U.S. Application Data

(60) Provisional application No. 60/272,033, filed on Mar. 1, 2001.

(51) Int. Cl.[7] .............................. B41F 9/00; B41C 1/00; G03F 7/095

(52) U.S. Cl. .................... 101/150; 101/153; 101/401.1; 430/307; 430/324

(58) Field of Search ................................ 101/150, 153, 101/401.1; 430/307, 324

(56) References Cited

U.S. PATENT DOCUMENTS

| | | | | | |
|---|---|---|---|---|---|
| 3,280,736 | A | * | 10/1966 | Schafler et al. | 101/459 |
| 3,636,251 | A | | 1/1972 | Daly et al. | |
| 4,437,942 | A | * | 3/1984 | Datwyler | 205/50 |
| 4,567,827 | A | * | 2/1986 | Fadner | 101/352.11 |
| 5,126,531 | A | | 6/1992 | Majima et al. | |
| 5,994,032 | A | * | 11/1999 | Goffing et al. | 430/307 |
| 6,048,446 | A | | 4/2000 | Michaelis | |
| 6,609,459 | B1 | * | 8/2003 | Figov | 101/150 |

FOREIGN PATENT DOCUMENTS

| | | | |
|---|---|---|---|
| EP | 0 816 920 | A | 1/1998 |
| GB | 1 310 651 | A | 3/1973 |
| GB | 2034636 | A | 6/1980 |

OTHER PUBLICATIONS

"Gravure Process and Technology" from the Gravure Association of America (p. 380).

* cited by examiner

*Primary Examiner*—Daniel J. Colilla
*Assistant Examiner*—Jill E. Culler
(74) *Attorney, Agent, or Firm*—Edward Langer; Shiboleth, Yisraeli, Roberts, Zisman & Co.

(57) ABSTRACT

A gravure printing blank that can be easily and quickly imaged digitally by means of laser imaging and a method for preparing the same. The gravure printing blank comprises a metallic surface, a pre-polymer layer covering said metallic surface, comprising UV curable materials, photo initiators and binder resins and a photo-tool layer covering said pre-polymer layer.

14 Claims, 6 Drawing Sheets

PROCESS AND MATERIAL FOR PRODUCING IR IMAGED GRAVURE CYLINDERS

This application claims the benefit of Provisional Application No. 60/272,033, filed Mar. 1, 2001.

FIELD OF INVENTION

This invention relates to a novel process and materials for producing infrared digitally imaged gravure cylinders.

BACKGROUND OF THE INVENTION

Gravure is one of the principal four traditional printing processes (the others being offset lithography, flexography and screen printing). Each of these processes is distinguished from the others by where the ink resides in relationship to the surface of the master and which areas of the master provide the non-ink or background areas. Flexographic plates have a raised surface that accepts the ink, the background being the recessed surface. Offset lithography has the ink and the background coplanar, with the difference between ink and background areas being determined by surface chemistry. Screen printing has the ink printing through holes in the master, with the background being provided by the remaining master surface. Gravure has the ink residing in indented cells, background being provided by the remaining upper surface.

Each printing method demands its own types of ink, its own imaging system(s) and its own presses. Each process has its own advantages and disadvantages.

"Gravure Process and Technology" from the Gravure Association Of America (page 380) explains the advantages and disadvantages of gravure. Gravure is regarded as a very simple process compared to flexo and offset lithography. It is more adaptable to less expensive paper, and it gives better image quality and color consistency. Its main disadvantage is the high cost and the time needed to engrave gravure cylinders. This makes the gravure process inappropriate for short runs and indeed it finds its place in very long runs of up to and beyond a million impressions.

Gravure cylinders are prepared by either imaging a photoresist through a film and then chemically etching the metallic surface of the cylinder, or by directly engraving the cylinder with some type of engraving tool. Electromechanical engraving is a slow process. Etching has to be very carefully controlled as it tends to spread laterally as it progresses downwards to give undercutting of cell walls.

In recent years, with the advent of computers, origination for reproduction by printing processes has become available in digital form and much work has been done in imaging printing plates digitally and more specifically using a modulated laser beam for such imaging. Because of the necessity for engraving specific holes to produce the cells needed for gravure, gravure printing has a long history of attempts to use lasers for digital imaging. Thus U.S. Pat. No. 3,636,251 to Daly et al describes a system for engraving intaglio printing plates by forming cells in a metal plate using a pulsed output laser. UK Patent Application, GB 2034636A claims that the former patent method has the disadvantage that it tends to produce rims round the gravure cells. The British patent claims an advantage in using polymeric printing blanks for laser engraving, where such blanks have high thermal conductivity. The areas struck by the laser are vaporized. Carbon black may be incorporated into the polymer to improve absorption of the laser energy. More recently, U.S. Pat. No. 5,126,531 to Majima et al described a method of producing a gravure printing plate using a thermoplastic resin sheet containing about 20 percent of carbon. The plate was wrapped around a cylinder and imaged by a semi-conductor laser beam.

U.S. Pat. No. 6,048,446 to Michaelis suggests building up walls by plating using a photoresist mask, but such masks are of thicknesses down to 1 micron, which makes them suitable for IR imaging but makes it impossible to then build up walls with straight sides to a thickness of 12 or more needed for good quality gravure cells. Thick plating using thin masks tend to spread so that they overhang the thin mask—a problem that the '446 patent fails to address.

SUMMARY OF THE INVENTION

The present invention provides a gravure printing blank that can be easily and quickly imaged digitally by means of laser imaging.

The present invention further provides a pre-polymer-metal cylinder printing blank in which pre-polymeric and other layers are coated onto the metal, wherein the uppermost surface can be imaged to take the form of a photo-tool that acts as a mask for depositing cell walls of uniform depth.

The present invention additionally provides a gravure printing blank where the top coat is an infrared absorbing layer, that after imaging acts as a UV mask, through which the internal areas of the cell in the gravure cylinder are hardened before washing out the polymer in the wall areas to expose the metal surface of the cylinder, which may subsequently be filled with a hard insoluble material by, for instance, plating to produce cell walls.

In an alternative embodiment, the present invention provides a process using a separately supported photo-tool, produced by conventional photographic or thermal means, that can be wrapped around the pre-polymer coated surface to provide a UV mask for hardening the areas of the pre-polymer corresponding to the internal part of the cells, before washing out the polymer in the wall areas to expose the metal surface of the cylinder, which may subsequently be filled with a hard insoluble material by, for instance, plating to produce cell walls.

In a further alternative embodiment, the present invention provides a means for preparing a gravure plate or cylinder, avoiding all etching or plating processes.

In a further alternative embodiment the present invention provides a pre-polymer metal cylinder printing blank, in which the pre-polymer is UV sensitive and can be digitally imaged so that it can then be selectively washed out, further cured and then provide a mask for depositing cell walls of uniform depth.

DETAILED DESCRIPTION OF THE INVENTION

Figure 1:
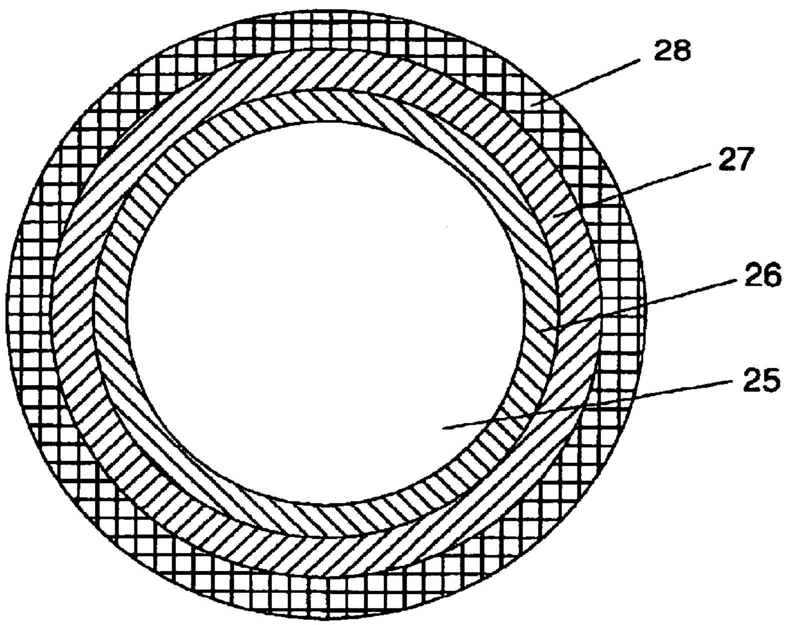
FIG. 1 diagrammatically shows a cylinder with various coating layers, as a blank to be imaged and processed in order to work the invention to produce the finished gravure cylinder.

Reference is made to FIG. 1, which represents diagrammatically the composition of an embodiment of the invention. The gravure printing blank may be in the form of a coated cylinder or a flexible printing plate that can be mounted on a cylinder for both imaging and printing. FIG. 1 shows the structural composition of the gravure cylinder. The cylinder 25 may be of metal such as copper, stainless steel, aluminum or anodized aluminum. Optionally, there may be a surface coating 26 of a second metal such as copper, deposited on the metal cylinder 25, or a plate wrapped around and bonded to the cylinder, the plate being composed of metals such a stainless steel, aluminum, anodized aluminum or copper. The surface of the coating or plate 26 is coated with a pre-polymer layer 27, whose composition will be described in more detail below. The dry thickness of layer 27 may be between 10 and 80 microns, but is preferably between 15 and 25 microns and is uniform throughout the coating area. This coating may be applied to the cylinder by a variety of known means. For instance, a ring method may be used, whereby the coating material, optionally dissolved in solvent, is placed between a ring concentric to the cylinder and with a larger radius, so that the gap is a uniform one, in which the thickness corresponds to that of the layer 27 in its wet form. In order to form the coating, the ring is moved upwards relative to the cylinder, so as to leave a uniform layer of material on every part of the cylinder. This method requires a relatively high viscosity for the material. Alternatively, the material may be dip coated or spray coated. After coating, any solvent used is evaporated off by heating.

The layer 27 is coated with a layer of carbon black 28, by any known coating method. Such a coating is relatively thin and is in the range of 0.3 to 3 microns, but preferably 0.8 to 1.5 microns.

Figure 2:
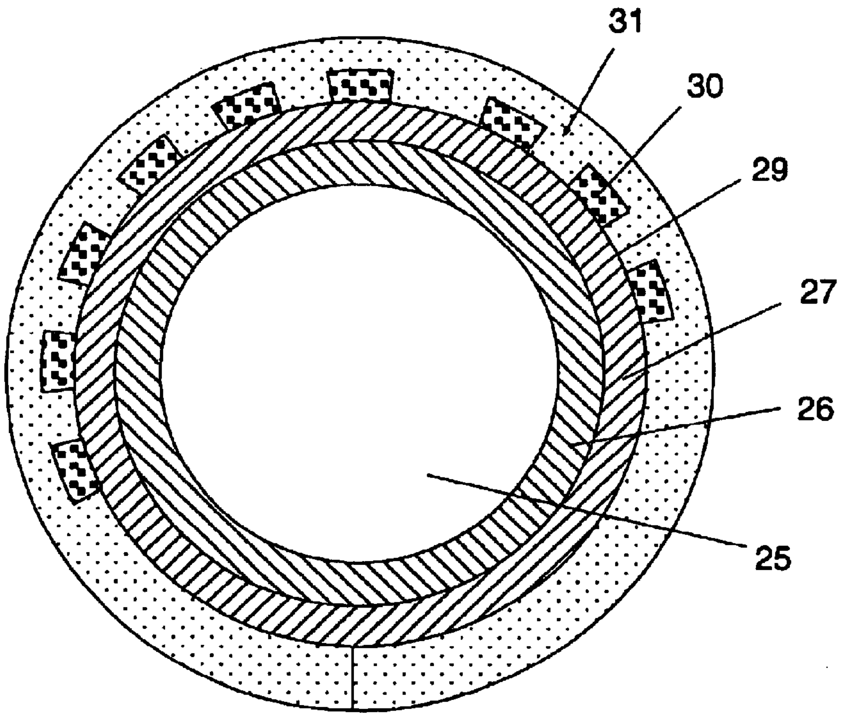
FIG. 2 diagrammatically shows a second embodiment, wherein a cylinder blank is imaged using a pre-prepared separate photo-tool.

Alternatively, as shown in FIG. 2, instead of coating layer 27 with carbon black 28, layer 27 can be used with a separate mask 31, which provides the photo-tool. The separate mask 31 has a transparent substrate 29 and image areas 30. The image has been previously formed, either as a conventional silver halide film or as a thermally imaged film or by any other imaging process.

The composition of the layer 27, when it is not used with a separate mask 31, but with the integral layer 28, comprises the following components:

a) Oligomers and monomers that can be cross-linked in the presence of a photoinitiator by means of irradiation with ultra violet light. The total amount of these should be between 25% and 85% by weight of the dry solids, respectively.

b) Photoinitiators and synergists that will generate and promote free radicals needed for the cross-linking reaction described in (a). These are present as up to 10% by weight of the oligomers and monomers.

c) Binder resins that are soluble in either water or dilute alkali and also non-aqueous solvent. These are present in quantities from 10% to 50% by weight.

In addition, there are optional ingredients such as fillers and wetting agents and dyes or pigments to aid visual examination of the layer. The entire mixture is deposited as a coating from a non-aqueous solvent. Dry layer thickness can be anything from 10 microns to 80 microns. This somewhat depends on its functionality, as described below.

Whereas a large range of UV curable materials and photo-initiators known in the art can provide useful components for layer 27, the preferred resins used are those showing suitable duality of solubility in both aqueous and non aqueous solvents. The resin system must be solvent soluble so that the monomers and oligomers of section (a) will dissolve easily and give a compatible dry film. The preferred resin system should have aqueous solubility, preferably at a pH of greater than 8 so that, as described below, the uncured layer can be washed away.

Although it is possible to make a system where the layer is washed away with organic solvent, it is environmentally desirable to have the layer water dissolvable. Examples of types of resins that are useful in the system are Novalaks (functionally substituted phenol-formaldehyde resins), styrene maleic anhydride copolymers, polyvinyl methyl ether/maleic anhydride copolymer and its esters, hydroxy propyl cellulose and esterified rosin-maleic esters.

In the embodiment of FIG. 1, using an integral photo-tool, layer 28 is coated on top of layer 27. The solvent used is preferably water and although water-soluble binders may be present, it is preferable to either include a small amount of an emulsion-containing binder or to omit binder from this layer entirely. It is not possible to use a solvent-based top layer unless such solvent does not attack the film of the layer 27. Although some small amount of solvent penetration from the top coat to the undercoat is expected, solvent attack of layer 27 is likely to adversely affect the quality of the imaging by ablation and to leave residual top layer on the underlayer, thus interfering with the UV curing stage. The remains of the layer 28 after selective ablation are also required to be washed away after UV exposure as described.

Other ingredients of layer 28 may be carbon black and surface active agent. This layer may also contain UV absorbing materials such as dyes or pigments, to enhance performance when this layer is used as a mask during the process and may contain infrared absorbing materials other than carbon black. The total thickness of this layer can be anywhere between 0.3 and 3 microns. The layers 27 and 28 must be such that once the total composite is made, the top layer 28 is not easily physically damaged by handling. With the layers described in this patent, it has been found that this is achieved by the interaction of layers 27 and 28. Thus, if the identical coating 28 is made on polyester film, the dried film will be very easily removed by gently rubbing with a finger. This is easily understood when there is no binder present, as it would be expected that without binder the layer would have no physical strength. However, when coated on layer 27 as described, the coating 28 exhibits rub resistance under identical conditions. This is particularly important as it permits layer 28 to be formulated with optimum sensitivity to infrared radiation, because of little or no binder present and at the same time to have sufficient UV optical density to give adequate masking conditions during the curing stage of the process.

Referring back to FIG. 1, during the digital imaging of the gravure blank, the layer 28 is ablated and debris collected by a suitably located vacuum system. The digital imaging is done by laser diodes. A suitable imaging system is that described in PCT Patent Application PCT/IL97/00525 (Publication No. WO 97/27065) to the present Applicant, incorporated herein by reference.

Figure 3A:
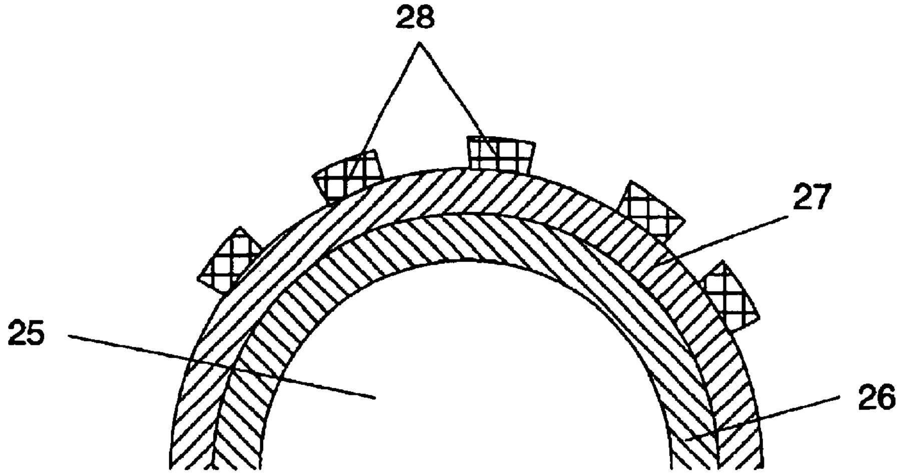
FIGS. 3A, 3B, 3C, 3D, 3E, 3F, 3G and 3H diagrammatically show a part of the cylinder, to explain the stages of the imaging and processing.

The ablated layer 28 is shown in FIG. 3A, with just the unablated areas remaining. These areas will eventually be the areas where the gravure cell walls are laid down.

Figure 3B:
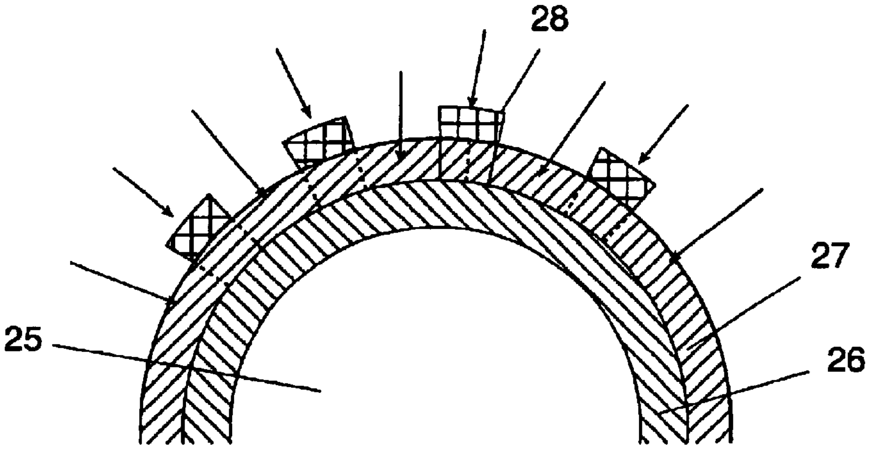

FIG. 3B shows the UV exposure, where the remaining areas of 28 provide a blocking mask, so that only the unblocked areas of layer 27 are hardened by polymerization caused by the UV exposure.

Figure 3C:
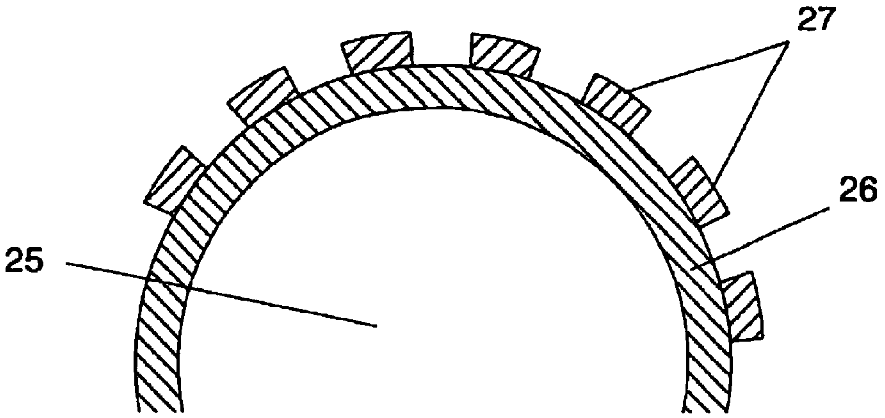

FIG. 3C shows the section of the cylinder after the unpolymerized areas of layer 27, together with the unablated areas of 28, have been removed by washing, exposing a metallic surface of the layer 26 or of the cylinder 25, if there is no layer 26. A second UV exposure may be made at this stage, to further harden off the remaining polymeric deposit.

Figure 3D:
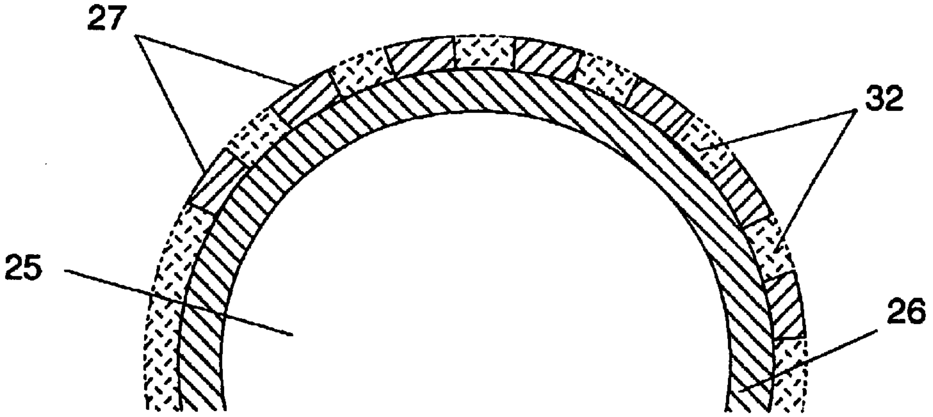

FIG. 3D shows the next stage of the process. In one embodiment, this depicts a layer 32 of metal deposited onto the exposed parts of layer 26, to form the cell walls of the gravure surface. The metal may be deposited by electroplating or by an electroless process. In the case of electroplating, deposition will only occur on the exposed metal surface. For electroless plating, no adhesion promoter is used, so that at the end of the process, the upper surface of the polymer 27 may be wiped clean of any metal deposit. Plating is timed to reach the required thickness and no greater than the upper surface of the remaining polymer. If this level is slightly exceeded, the surface may be polished down slightly before the removal of the polymer 27 with suitable solvent. If the metal used is, for instance, a relatively soft one such as copper, the resulting cells with copper walls are then plated with chromium to give the finished cylinder. This plating may be done either before or after removal of the polymer layer 27. In the case of chromium plating before polymer removal, this means that the inner cell walls and cell floor remain with external copper surfaces.

Alternatively, instead of plating with copper, a tougher metallic layer such as chromium can be used to form the cell walls. Such walls will not require the additional stage of plating that is necessary if copper is used to form the walls.

As present, gravure image processing plants include means for recovering cylinders by stripping off the image and re-plating with copper and also have chromium plating facilities. It is evident that such plants would have the necessary equipment to form the cell walls by plating processes as described above and would not need to re-equip. If the walls are composed of electrodeposited chromium, then the cylinder may be re-used with a new image by removing the chromium layer before re-coating with polymer. Existing processes generally utilize both copper and chromium layers. Copper is used in electromechanical imaging because it is soft and in etching processes because it is relatively easy to etch. The use of chromium to produce the walls by plating thus eliminates a stage in existing processes. This stage in existing processes is necessary by the nature of the process, because chromium cannot easily be electromechanically imaged and cannot easily be etched.

Figure 3E:
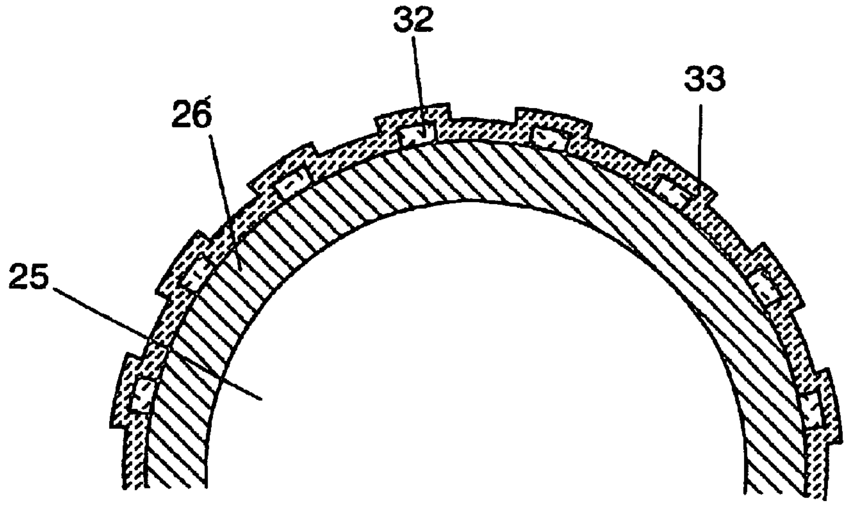

FIG. 3E represents the embodiment where the polymer layer 27 has now been entirely removed and a chromium layer 33 has been deposited.

Figure 3F:
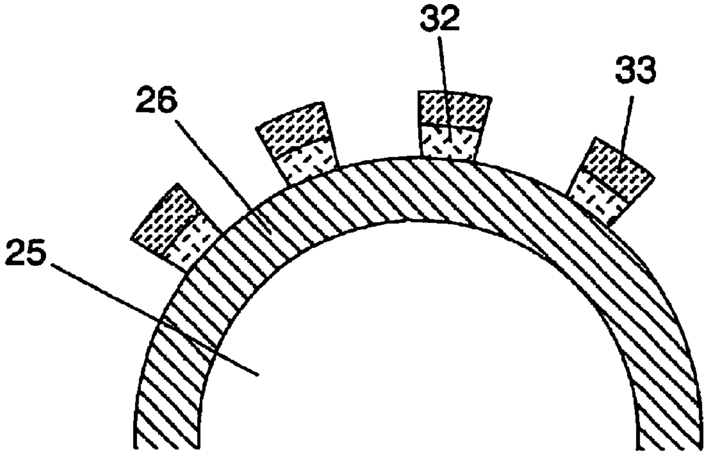

FIG. 3F shows an embodiment where the polymer 27 was removed after electrodeposition of the chromium layer.

Figure 3G:
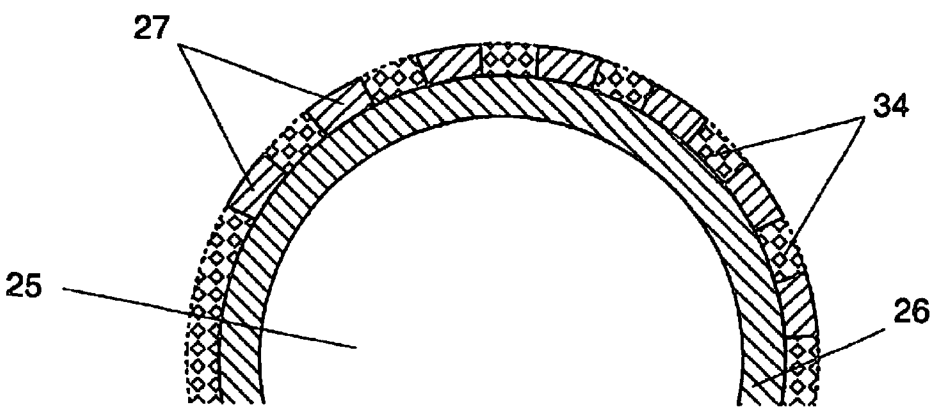

In an alternative embodiment, FIG. 3G depicts the coating of the plate or cylinder with a non-metallic material 34, that forms a hard insoluble layer of unified thickness over the entire surface, excluding the cells that are still filled with polymer. This is effected by using a gap coating method, whereby the gap has the same height as the polymer filled cells.

Figure 3H:
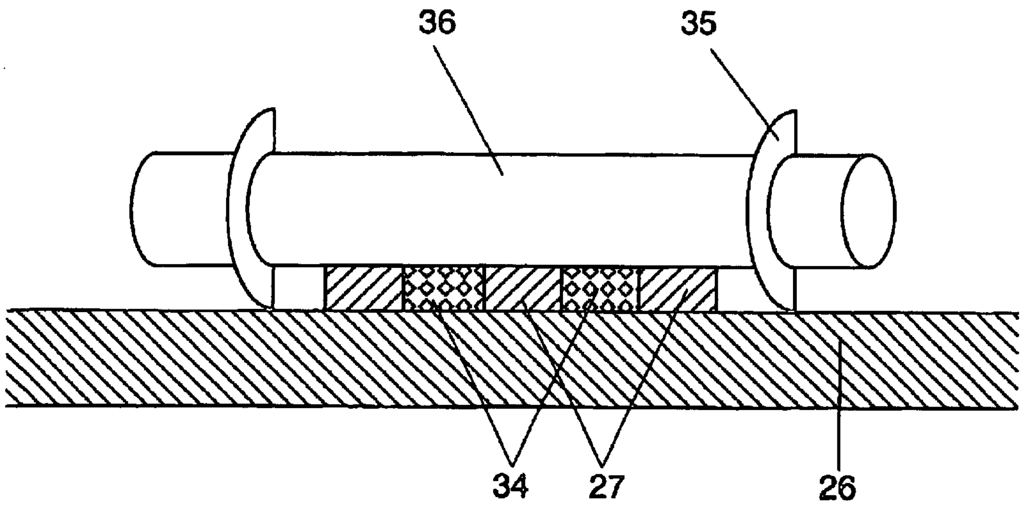

FIG. 3H shows a rod 36 with two rings 35, providing the gap by contact with the layer 26 as well as by touching the polymer filled cells 27. The layer to 34 is applied in the gap which has a height determined by the required wet thickness. The material should be cross-linked after coating and may be, for instance, an epoxy system, filled or unfilled—either one or two component, or a UV curing system or any other coatable material that can be hardened by cross-linking after coating. The viscosity of the material should be sufficiently low as to permit the filling up of the gaps corresponding to the narrowest cell walls—i.e. the walls filling the largest cells corresponding to the full tone printing area when the finished gravure plate or cylinder is used. If a plate is produced, it may be mounted by bonding to a cylinder so that there remains a minimum gap where the ends of the cylinder meet. When the coating is applied, it will automatically cover this gap. After the coating has hardened, the polymeric material is removed from the gap by washing out with solvent. It is possible that the wall forming material in its liquid form may contain solvent that will be evaporated before curing. If this is the case, the cell walls may be of sufficient height as to compensate for shrinkage of the filling material when solvent is lost. Either before or after the removal of the polymer filling the cells, the surface of the cylinder may be sanded and polished to give an even surface.

Figure 4:
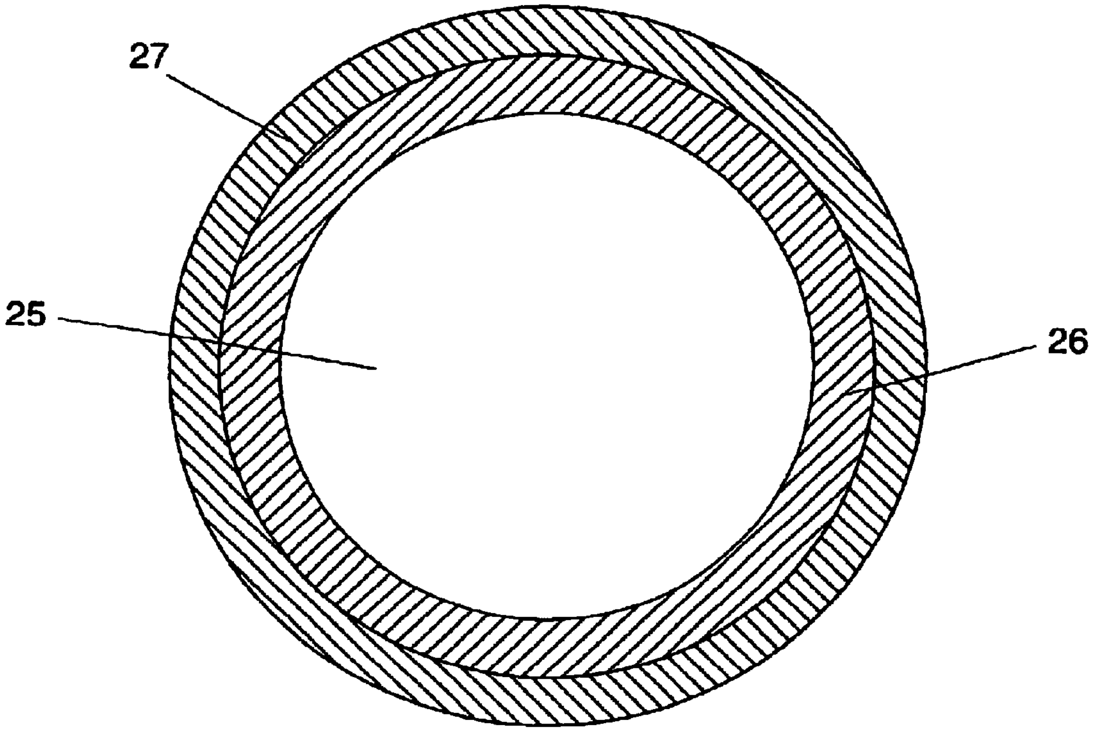
FIG. 4 diagrammatically shows another embodiment, wherein a cylinder blank is directly digitally imaged with UV radiation.

A further embodiment of the invention is described in reference to FIG. 4. This is an identical structure to that shown in FIG. 1, except that in the embodiment of FIG. 4 there is no carbon layer. Digital imaging is done directly with a UV modulated light source. The UV exposure hardens the inside of the cells directly and the non-hardened areas are removed by washing. A second UV exposure may be performed at this stage, to further harden off the remaining polymeric deposit and the process then proceeds as shown from FIG. 3D onwards.

Thus, the method of producing gravure printing plates according to the present invention is distinguished from other known methods in that it neither uses photomechanical imaging nor an etching process to produce a gravure image formed of a metallic layer. This saves on disposal problems for etchant is solutions. Also, the process of etching is subject to under-cutting—the expansion of cell size as the etchant penetrates and spreads below the cell walls. This limits the thinness of cell walls. The present invention provides pre-formed polymer moulds to give vertical sided walls.

It should be clear that the processes described above can be made to generate a gravure image pattern whereby the ablated areas that were originally imaged by the infrared radiation become the cells, which will then receive ink during the printing process and the unablated areas become the gravure cell walls.

EXAMPLE

The following example describes an experimental plate, constructed and produced to illustrate the invention.

The following composition was made up (parts by weight) and milled in a ball mill for 2 hours;

| | |
|---|---|
| Methyl Ethyl Ketone | 150 parts |
| Kaolin | 34 parts |
| Sartomer SR 9020 | 20 parts |
| Cab-O-Sil M5 | 12 parts |

After milling, the following ingredients (all parts by weight) were added and stirred in, one by one:

| | |
|---|---|
| Aerosol OT | 5 parts |
| BYK 307 | 4 parts |
| Cellosolve Acetate | 31 parts |
| Ebecryl IBOA | 15 parts |
| KTO 46 | 21 parts |
| SB 401 | 58 parts |
| Scripset 550 | 22 parts |
| SB 520 E35 | 6 parts |
| Sylvaprint (50% IPA solution | 54 parts |
| Sartomer SR 368 | 53 parts |
| Sudan Black B | 0.17 parts |

The mixture was bar coated onto 100 micron epoxy, coated with 12 microns of copper to a dry weight thickness of 25 microns by evaporation of the solvent at 140° C. for 2 minutes. This constituted layer 27 in this example.
The following composition was made up;

| | |
|---|---|
| Cab-O-Jet 200 | 35.2 parts |
| Water | 10.5 parts |
| Superwetting Agent | 2.2 parts |

This material was bar coated on top of the previously described layer, to a dry weight of 0.8 grams per square meter and air-dried. It was not possible to easily measure the thickness of this coat, as it penetrated the surface of the previous coating and became bound in to the extent that it could be handled without causing damage, even though it did not contain any binder itself. The same coat, when applied to uncoated polyester film and dried, showed absolutely no adhesion to this surface.

The above composition constituted layer 28 in this example. This finished member was then mounted on a drum, as shown in the FIG. 1 and exposed by a laser diode array as described hereinabove. The image was in the form of cells. Exposure was such as to create an energy flux of 1100 milli Joules per square centimeter. The imaged plate was flood exposed to UVA UV radiation. The member was then washed with a solution of the following composition (parts by weight):

| | |
|---|---|
| Distilled Water | 350 parts |
| Sodium Carbonate | 2.2 parts |
| Benzyl Alcohol | 4.0 parts |
| Sodium lauryl sulphate | 1.8 parts |

The member was then rinsed with water, dried and then flood exposed with UV light.

The resulting plate was then used as the cathode in a plating bath of copper sulfate and sulfuric acid with a copper anode. Plating was continued until a 20 micron thickness was attained.

The polymer was then washed away with ethyl lactate and the copper plate was finished off by electroplating with chromium.

What is claimed is:

1. A method for preparing a gravure printing surface, comprising the steps of:

providing a printing blank comprising:
metallic surface;
a pre-polymer layer covering said metallic surface, comprising UV curable materials, photo intiators and binder resins; and a photo-tool layer covering said pre-polymer layer;

ablation imaging said photo-tool layer with IR radiation to form a UV mask;

exposing said printing blank to UV radiation through said imaged photo-tool, thereby polymerizing the areas imaged in said step of imaging;

washing said printing blank to remove non-ablated and non-polymerized areas;

depositing metal onto said washed areas, thereby forming calls of said gravure printing blank; and removing said pre-polymer layer from within said cells.

2. The method of claim 1, wherein said step of depositing is done by a process of electroplating.

3. The method of claim 1, wherein said step of depositing is done by an electroless process.

4. The method of claim 1, additionally comprising a step of plating following said step of depositing.

5. The method of claim 1, additionally comprising a step of plating following said step of removing.

6. The method of claim 1, wherein the gravure printing surface comprises a gravure cylinder.

7. The method of claim 1, wherein the gravure printing surface comprises a gravure plate.

8. A gravure printing surface produced according to the method of claim 1.

9. The gravure printing surface of claim 8, wherein the step of depositing is done by a process of electroplating.

10. The gravure printing surface of claim 8, wherein the step of depositing is done by an electroless process.

11. The gravure printing surface of claim 8, wherein said step of depositing is followed by an additional plating.

12. The gravure printing surface of claim 8, wherein said step of removing is followed by an additional plating.

13. The gravure printing surface of claim 8, comprising a gravure cylinder.

14. The gravure printing surface of claim 8, comprising a gravure plate.

* * * * *

UNITED STATES PATENT AND TRADEMARK OFFICE

CERTIFICATE OF CORRECTION

PATENT NO. : 6,928,926 B2
DATED : August 16, 2005
INVENTOR(S) : Igal Koifman, Murray Figov and Elena Eisurovich It is certified that error appears in the above-identified patent and that said Letters Patent is hereby corrected as shown below:

Column 8,
Line 25, "calls of said gravure printing blank" should be -- cells of said gravure printing blank --.

Signed and Sealed this

Eighth Day of November, 2005

JON W. DUDAS
*Director of the United States Patent and Trademark Office*